(12) United States Patent
Chang et al.

(10) Patent No.: US 9,905,515 B2
(45) Date of Patent: Feb. 27, 2018

(54) INTEGRATED CIRCUIT STRESS RELEASING STRUCTURE

(71) Applicant: MEDIATEK INC., Hsin-Chu (TW)

(72) Inventors: Chin-Chiang Chang, Kaohsiung (TW); Tao Cheng, Hsinchu County (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 14/686,783

(22) Filed: Apr. 15, 2015

(65) Prior Publication Data
US 2016/0043040 A1    Feb. 11, 2016

Related U.S. Application Data

(60) Provisional application No. 62/034,931, filed on Aug. 8, 2014.

(51) Int. Cl.
*H01L 23/00* (2006.01)
*H01L 23/31* (2006.01)
*H01L 23/498* (2006.01)

(52) U.S. Cl.
CPC ........ *H01L 23/562* (2013.01); *H01L 23/3107* (2013.01); *H01L 23/3121* (2013.01); *H01L 23/49838* (2013.01); *H01L 2224/48091* (2013.01); *H01L 2924/00014* (2013.01)

(58) Field of Classification Search
CPC ............... H01L 23/562; H01L 23/3107; H01L 23/3121; H01L 23/49838; H01L 23/36; H01L 21/4871; H01L 23/49544
See application file for complete search history.

(56) References Cited

U.S. PATENT DOCUMENTS

| | | | | |
|---|---|---|---|---|
| 4,797,726 A * | 1/1989 | Manabe | ............ | H01L 23/49503 257/669 |
| 4,918,511 A * | 4/1990 | Brown | ............. | H01L 23/49503 257/669 |
| 5,126,820 A * | 6/1992 | Brown | ............. | H01L 23/49503 257/420 |
| 6,204,553 B1 * | 3/2001 | Liu | .................. | H01L 23/49503 257/669 |
| 7,049,685 B2 * | 5/2006 | James | .................. | H01L 21/565 257/669 |
| 7,385,277 B2 * | 6/2008 | Eun | ..................... | H01L 23/3192 257/638 |

(Continued)

FOREIGN PATENT DOCUMENTS

CN    101399212 A    4/2009
CN    101546718 A    9/2009
(Continued)

*Primary Examiner* — David Zarneke
(74) *Attorney, Agent, or Firm* — Wolf, Greenfield & Sacks, P.C.

(57) ABSTRACT

The present invention provides an integrated circuit (IC) package with stress releasing structure. The IC package comprises: a metal plane, a substrate, an IC chip, and an IC fill layer. The metal plane has at least one first etching line for separating the metal plane into a plurality of areas. The substrate is formed on metal layer. The IC chip is formed on the substrate, and the IC fill layer is formed around the IC chip. The at least one first etching line forms at least one half cut line in the metal plane and the substrate.

7 Claims, 11 Drawing Sheets

(56) References Cited

U.S. PATENT DOCUMENTS

| | | | | |
|---|---|---|---|---|
| 7,781,851 B2* | 8/2010 | Seo | ................ | H01L 23/562 257/178 |
| 8,004,069 B2* | 8/2011 | Bauer | ................ | H01L 23/49503 257/666 |
| 8,049,311 B2* | 11/2011 | Lim | ................ | H01L 21/568 257/659 |
| 8,053,336 B2* | 11/2011 | Wu | ................ | B81C 1/00666 438/126 |
| 8,866,273 B2* | 10/2014 | Tan | ................ | H01L 23/4951 257/666 |
| 9,123,712 B1* | 9/2015 | Do | ................ | H01L 23/49565 |
| 9,281,256 B2* | 3/2016 | Ding | ................ | H01L 23/3107 |
| 9,318,404 B2* | 4/2016 | Lin | ................ | H01L 21/561 |
| 9,397,019 B2* | 7/2016 | Albers | ................ | H01L 24/97 |
| 9,510,306 B2* | 11/2016 | Yang | ................ | H04W 56/0015 |
| 2007/0102793 A1* | 5/2007 | Eun | ................ | H01L 23/3192 257/620 |
| 2008/0305306 A1 | 12/2008 | Yu | | |
| 2012/0086003 A1* | 4/2012 | Park | ................ | H01L 21/56 257/48 |
| 2013/0009291 A1* | 1/2013 | Kim | ................ | H01L 23/3142 257/666 |
| 2015/0069591 A1* | 3/2015 | Fischer | ................ | H01L 21/7685 257/676 |
| 2015/0243572 A1* | 8/2015 | Albers | ................ | H01L 23/3128 257/778 |
| 2015/0262941 A1* | 9/2015 | Steffen | ................ | H01L 23/562 257/690 |
| 2016/0079121 A1* | 3/2016 | Sorabji | ................ | H01L 23/562 438/462 |
| 2016/0181183 A1* | 6/2016 | Zhang | ................ | H01L 23/3142 257/669 |

FOREIGN PATENT DOCUMENTS

| | | |
|---|---|---|
| DE | 10 2006 015 241 A1 | 6/2007 |
| DE | 10 2010 054 781 A1 | 6/2012 |
| TW | 200701312 | 1/2007 |
| WO | 03073500 A1 | 9/2003 |
| WO | 2012165111 A1 | 12/2012 |

* cited by examiner

FIG. 11

INTEGRATED CIRCUIT STRESS RELEASING STRUCTURE

CROSS REFERENCE TO RELATED APPLICATIONS

This application claims the benefit of U.S. Provisional Application No. 62/034,931, filed on Aug. 8, 2014 and included herein by reference.

BACKGROUND

The disclosed embodiments of the present invention relate to an integrated circuit (IC) package, and more particularly, to an IC package with stress releasing structure.

Figure 1:
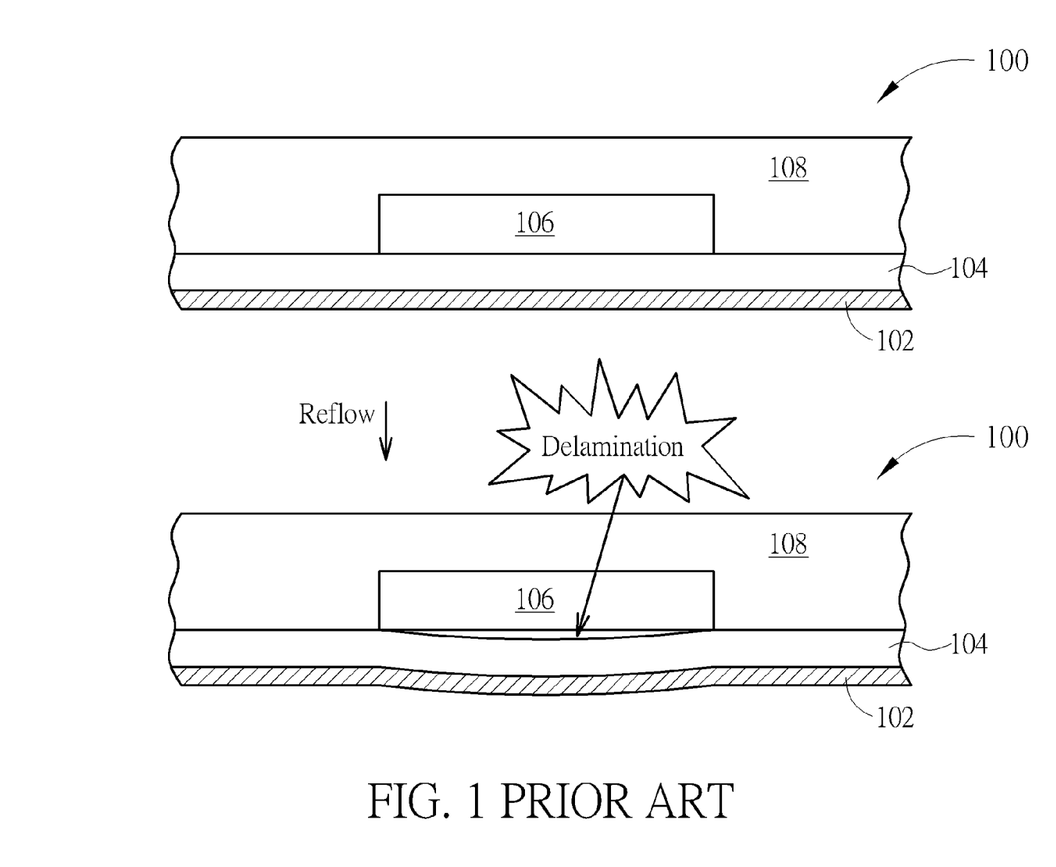
FIG. 1 is a conventional IC package during a reflow process.

Please refer to FIG. 1. FIG. 1 is a conventional IC package 100 during a reflow process. As shown in FIG. 1, the conventional IC package 100 comprises: a copper plane 102, a substrate 104, an IC chip 106, and an IC fill layer 108. As shown in FIG. 1, after the reflow process, a delamination problem happens due to a large stress between the copper plane 102, the substrate 104, and the IC chip 106, and the IC package 100 will fail due to the delamination problem.

SUMMARY

In accordance with exemplary embodiments of the present invention, an integrated circuit (IC) package with stress releasing structure is proposed to solve the above-mentioned problem.

According to a first aspect of the present invention, an exemplary IC package with stress releasing structure is disclosed. The exemplary IC package comprises: a metal plane, a substrate, an IC chip, and an IC fill layer. The metal plane has at least one first etching line for separating the metal plane into a plurality of areas. The substrate is formed on metal layer. The IC chip is formed on the substrate, and the IC fill layer is formed around the IC chip. The at least one first etching line forms at least one half cut line in the metal plane and the substrate.

According to a first aspect of the present invention, an exemplary IC package with stress releasing structure is disclosed. The exemplary IC package comprises: a metal plane, a substrate, at least one bonding wire, an IC chip, and an IC fill layer. The metal plane has at least one first etching line for separating the metal plane into a plurality of areas. The substrate is formed on metal layer, wherein the at least one first etching line separates the substrate into a plurality of substrate areas. The IC chip is formed on the substrate, and the IC fill layer is formed around the IC chip. The at least one first etching line forms at least one full cut line in the metal plane and the substrate.

Briefly summarized, the IC package with stress releasing structure disclosed by the present invention can separate the metal plane into a plurality of small metal planes in order to release stress, so as to solve the delamination problem of the IC package during a reflow process.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 2:
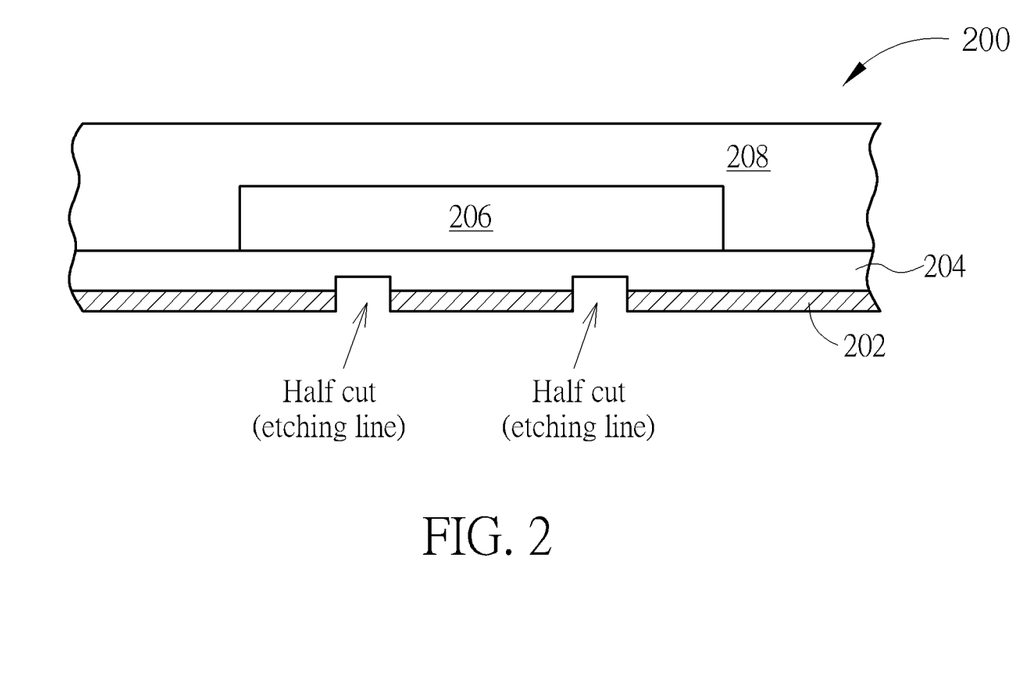
FIG. 2 is a simplified cross-sectional diagram of an IC package with stress releasing structure in accordance with a first embodiment of the present invention.
Figure 3:
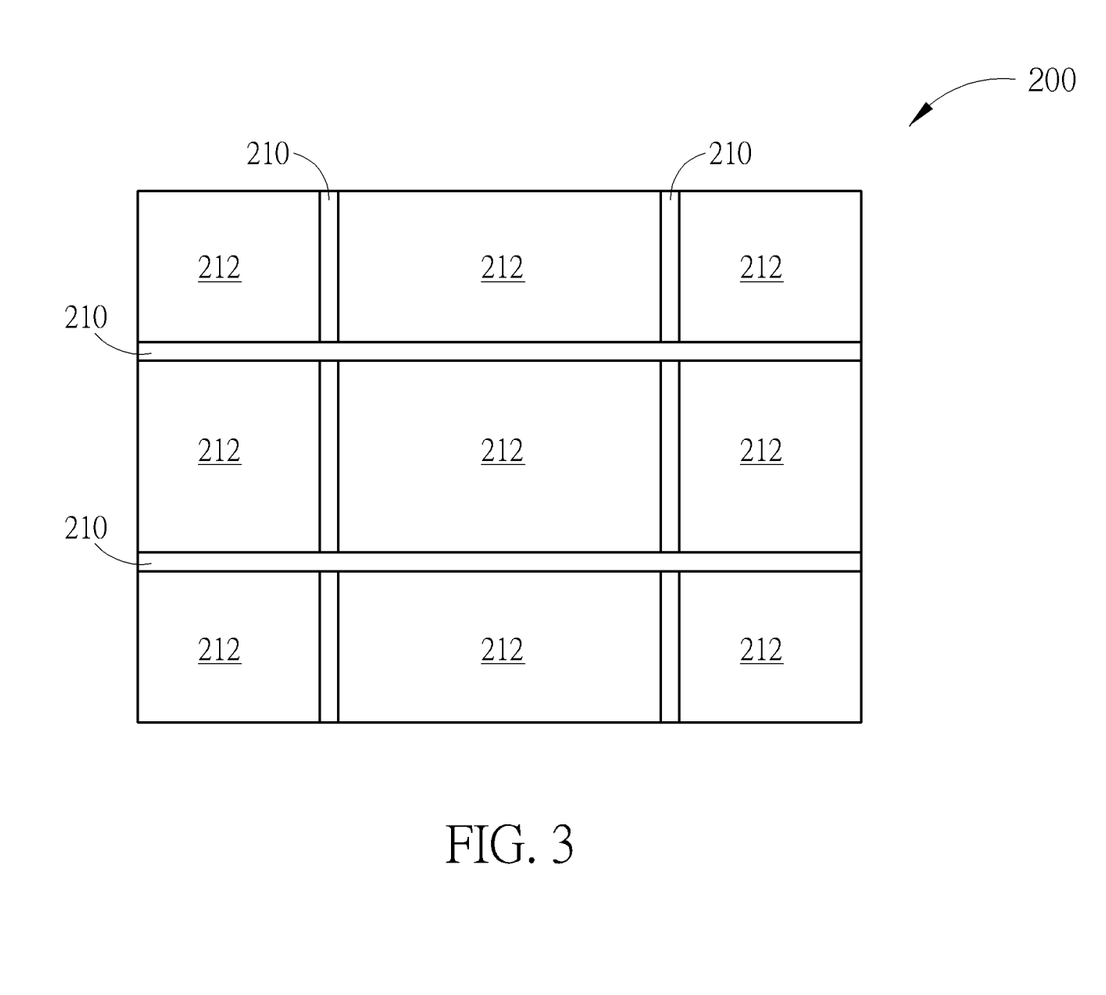
FIG. 3 is a simplified bottom view diagram of the IC package with stress releasing structure in accordance with a first embodiment of the present invention.

Please refer to FIG. 2 and FIG. 3 together. FIG. 2 is a simplified cross-sectional diagram of an integrated circuit (IC) package 200 with stress releasing structure in accordance with a first embodiment of the present invention, and FIG. 3 is a simplified bottom view diagram of the IC package 200. As shown in FIG. 2, the IC package 200 comprises: a metal plane 202, a substrate 204, an IC chip 206, and an IC fill layer 208. The metal plane 202 has 4 etching lines 210 for separating the metal plane 202 into 9 small metal plane areas 212 as shown in FIG. 3, wherein the metal plane 202 can be a copper plane. In other words, the 4 etching lines 210 form 4 half cut lines in the metal plane 202 and the substrate 204 as shown in FIG. 2. The substrate 204 is formed on metal layer 202. The IC chip 206 is formed on the substrate 204, and the IC fill layer 208 is formed around the IC chip 206. Please note that the above embodiment is only for an illustrative purpose and is not meant to be a limitation of the present invention. For example, the number of the etching lines 210 can be changed according to different design requirements.

Figure 4:
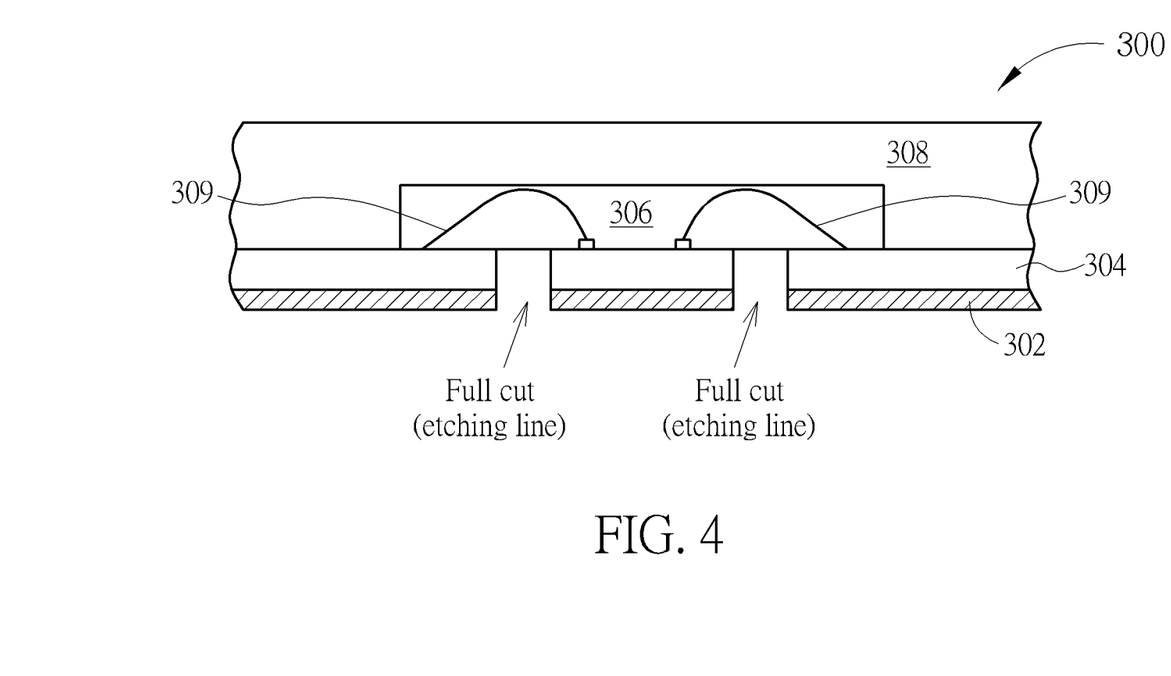
FIG. 4 is a simplified cross-sectional diagram of an IC package with stress releasing structure in accordance with a second embodiment of the present invention.
Figure 5:
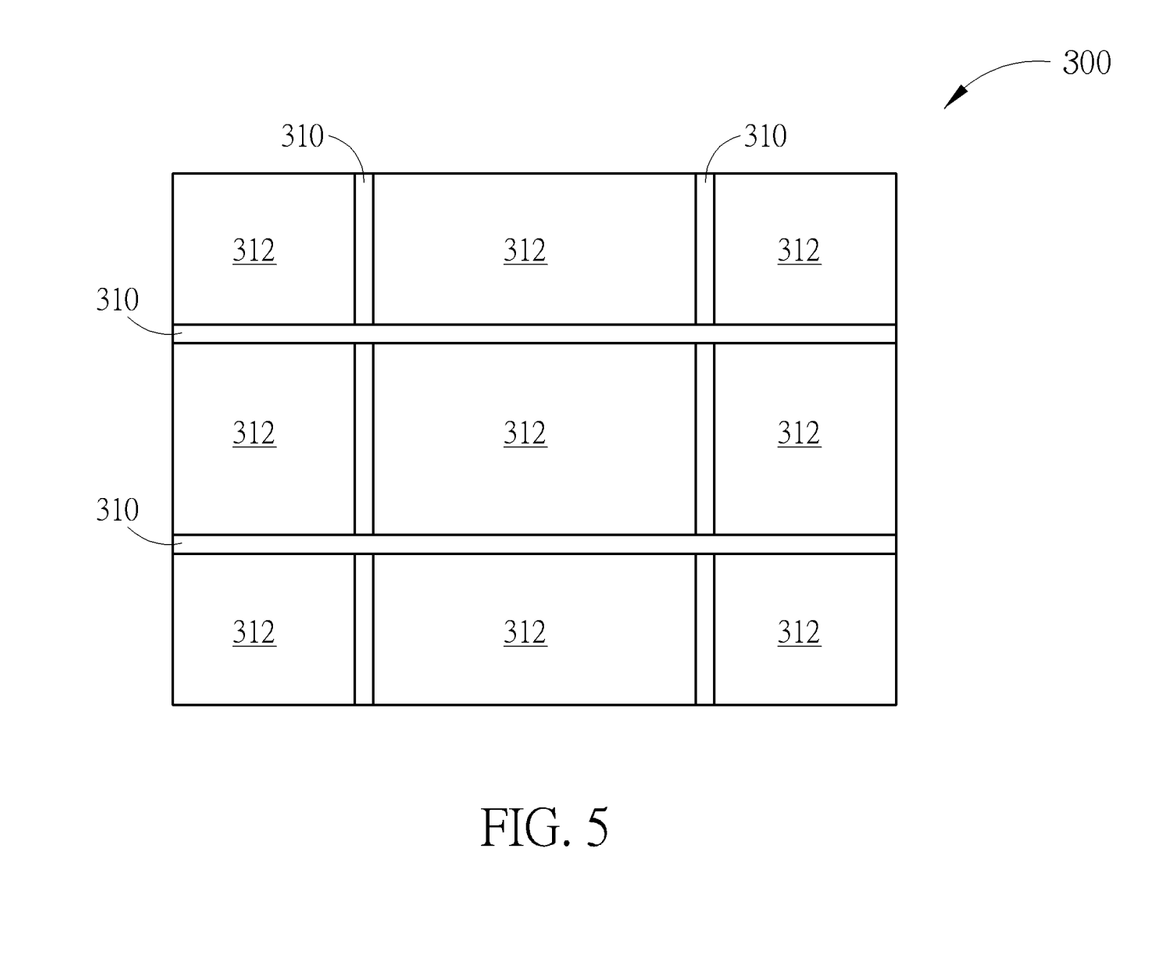
FIG. 5 is a simplified bottom view diagram of the IC package with stress releasing structure in accordance with a second embodiment of the present invention.

Please refer to FIG. 4 and FIG. 5 together. FIG. 4 is a simplified cross-sectional diagram of an IC package 300 with stress releasing structure in accordance with a second embodiment of the present invention, and FIG. 5 is a simplified bottom view diagram of the IC package 300. As shown in FIG. 4, the IC package 300 comprises: a metal plane 302, a substrate 304, an IC chip 306, an IC fill layer 308, and 2 bonding wires 309. The metal plane 302 has 4 etching lines 310 for separating the metal plane 302 into 9 small metal plane areas 312 as shown in FIG. 5, wherein the metal plane 302 can be a copper plane. The substrate 304 is formed on metal layer 302, and the 4 etching lines 310 also separate the substrate 304 into 9 small substrate areas. In other words, the 4 etching lines 310 form 4 full cut lines in the metal plane 302 and the substrate 304 as shown in FIG. 4. The IC chip 306 is formed on the substrate 304, and the IC fill layer 308 is formed around the IC chip 306. Please note that the above embodiment is only for an illustrative purpose and is not meant to be a limitation of the present invention. For example, the number of the etching lines 310 can be changed according to different design requirements.

Figure 6:
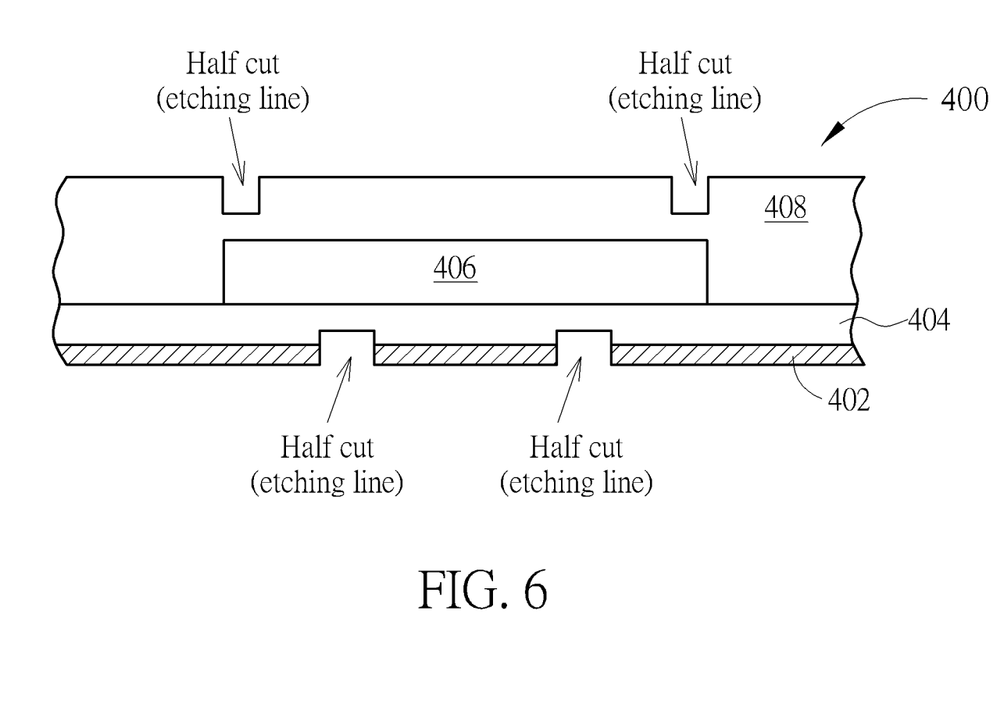
FIG. 6 is a simplified cross-sectional diagram of an IC package with stress releasing structure in accordance with a third embodiment of the present invention.
Figure 7:
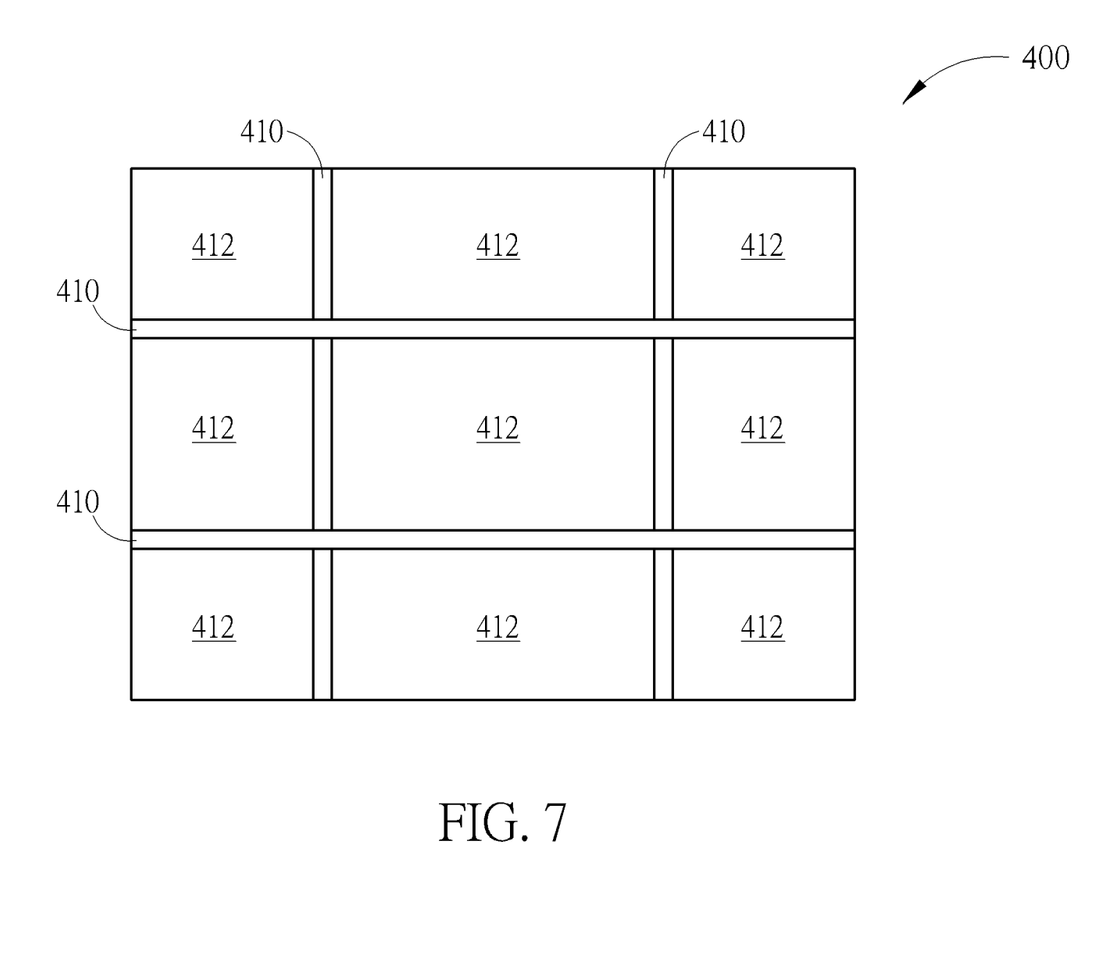
FIG. 7 is a simplified bottom view diagram of the IC package with stress releasing structure in accordance with a third embodiment of the present invention.
Figure 8:
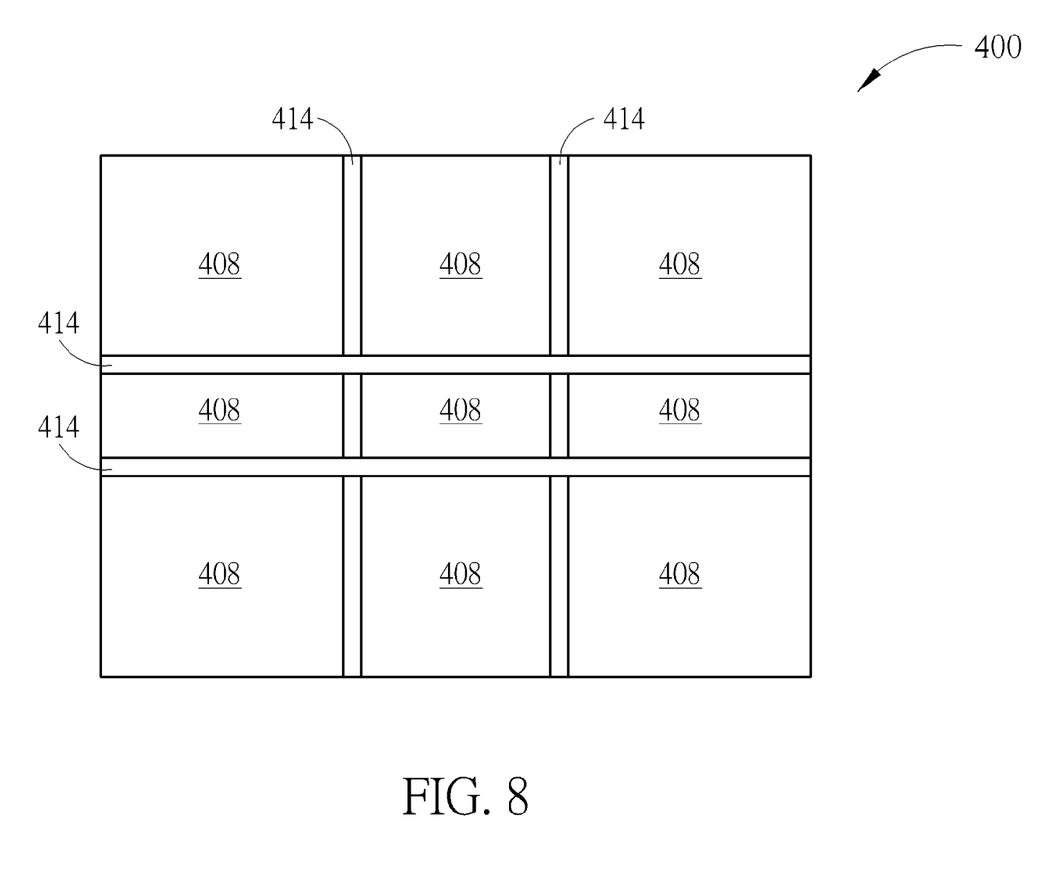
FIG. 8 is a simplified top view diagram of the IC package with stress releasing structure in accordance with a third embodiment of the present invention.

Please refer to FIG. 6, FIG. 7, and FIG. 8 together. FIG. 6 is a simplified cross-sectional diagram of an IC package 400 with stress releasing structure in accordance with a third embodiment of the present invention, and FIG. 7 is a simplified bottom view diagram of the IC package 400, and FIG. 8 is a simplified top view diagram of the IC package 400. As shown in FIG. 4, the IC package 400 comprises: a metal plane 402, a substrate 404, an IC chip 406, and an IC fill layer 408.

The metal plane 402 has 4 first etching lines 410 for separating the metal plane 402 into 9 small metal plane areas 412 as shown in FIG. 7, wherein the metal plane 402 can be a copper plane. In other words, the 4 first etching lines 410 form 4 half cut lines in the metal plane 402 and the substrate 404 as shown in FIG. 4. The substrate 404 is formed on metal layer 404, and the IC chip 406 is formed on the substrate 404. The IC fill layer 408 is formed around the IC chip 406, and the IC fill layer 408 has 4 second etching lines 414 for separating the IC fill layer 408 into a plurality of areas as shown in FIG. 8. In other words, the 4 second etching lines 414 form 4 half cut lines in the IC fill layer 408 as shown in FIG. 6.

Please note that the above embodiment is only for an illustrative purpose and is not meant to be a limitation of the present invention. For example, the numbers of the first etching lines 410 and the second etching lines 414 can be changed according to different design requirements.

Figure 9:
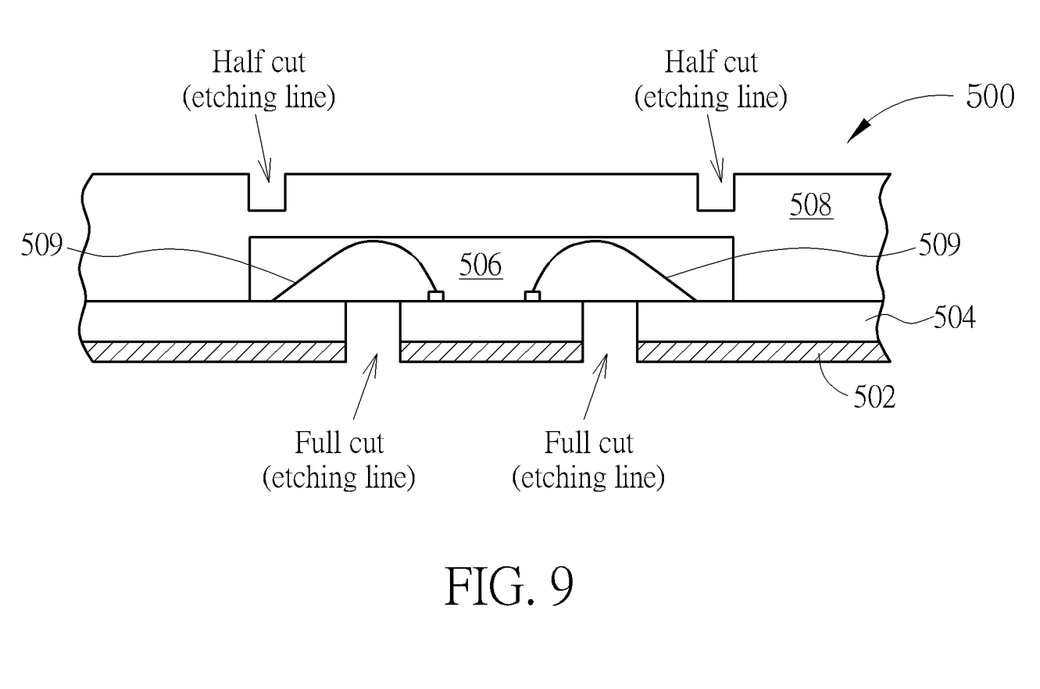
FIG. 9 is a simplified cross-sectional diagram of an IC package with stress releasing structure in accordance with a fourth embodiment of the present invention.
Figure 10:
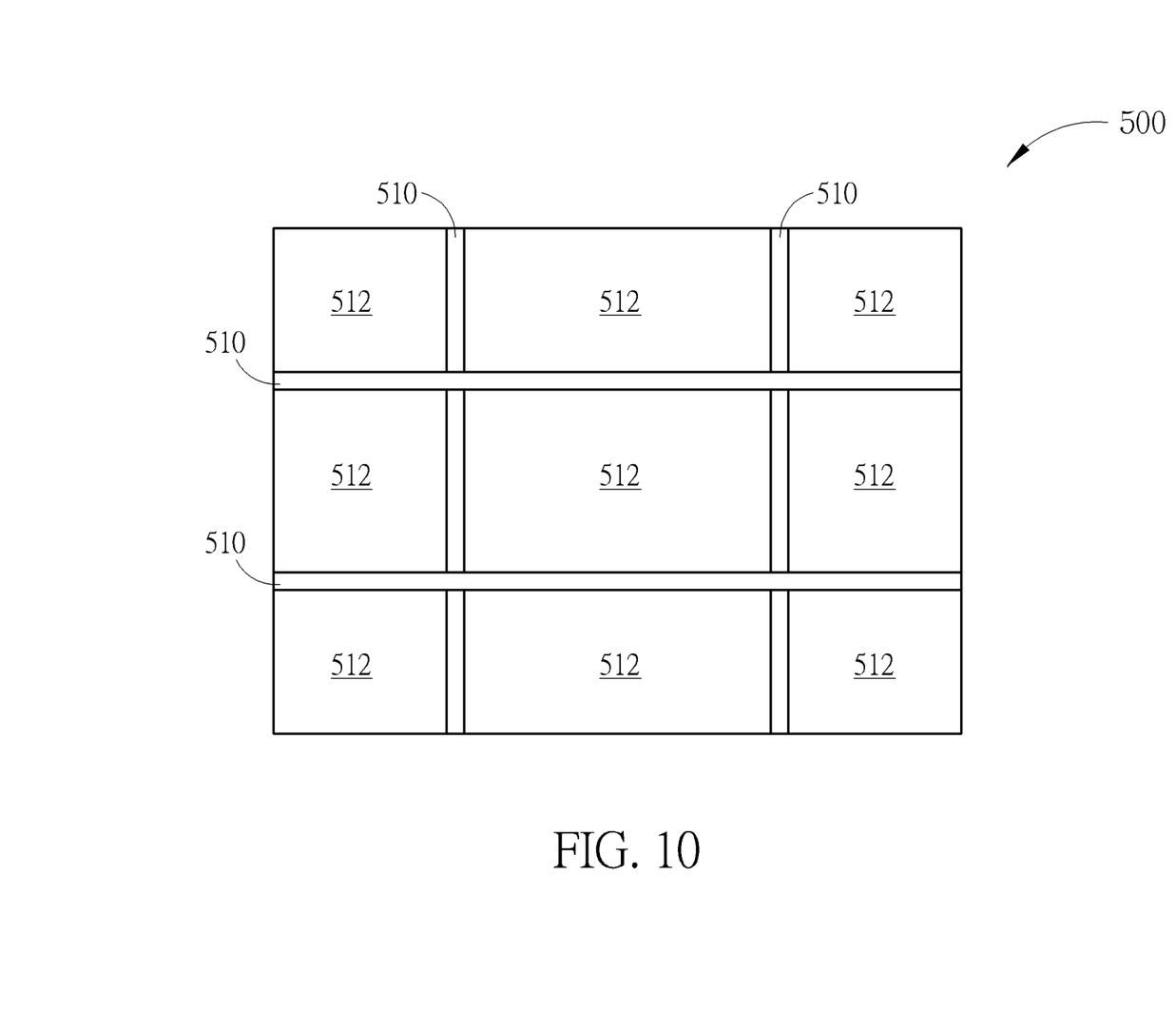
FIG. 10 is a simplified bottom view diagram of the IC package with stress releasing structure in accordance with a fourth embodiment of the present invention.
Figure 11:
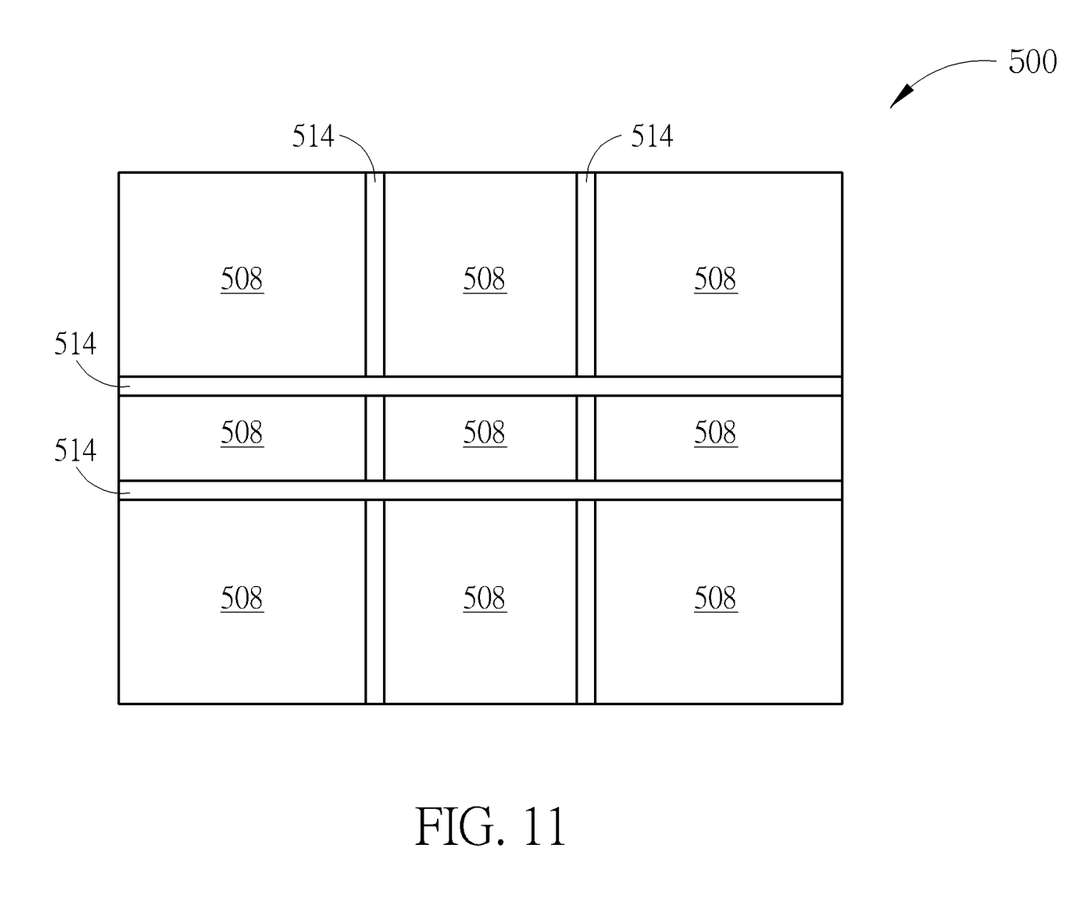
FIG. 11 is a simplified top view diagram of the IC package with stress releasing structure in accordance with a fourth embodiment of the present invention.

Please refer to FIG. 9, FIG. 10, and FIG. 11 together. FIG. 9 is a simplified cross-sectional diagram of an IC package 500 with stress releasing structure in accordance with a fourth embodiment of the present invention, and FIG. 10 is a simplified bottom view diagram of the IC package 500, and FIG. 11 is a simplified top view diagram of the IC package 500. As shown in FIG. 9, the IC package 500 comprises: a metal plane 502, a substrate 504, an IC chip 506, an IC fill layer 508, and 2 bonding wires 509. The metal plane 502 has 4 etching lines 510 for separating the metal plane 502 into 9 small metal plane areas 512 as shown in FIG. 10, wherein the metal plane 502 can be a copper plane. The substrate 504 is formed on metal layer 502, and the 4 etching lines 510 also separate the substrate 504 into 9 small substrate areas. In other words, the 4 etching lines 510 form 4 full cut lines in the metal plane 502 and the substrate 504 as shown in FIG. 9. The IC chip 506 is formed on the substrate 504, and the IC fill layer 508 is formed around the IC chip 506.

The IC fill layer 508 has 4 second etching lines 414 for separating the IC fill layer 408 into a plurality of areas as shown in FIG. 11. In other words, the 4 second etching lines 414 form 4 half cut lines in the IC fill layer 408 as shown in FIG. 9. Please note that the above embodiment is only for an illustrative purpose and is not meant to be a limitation of the present invention. For example, the numbers of the first etching lines 510 and the second etching lines 514 can be changed according to different design requirements.

Briefly summarized, the IC package with stress releasing structure disclosed by the present invention can separate the metal plane into a plurality of small metal planes in order to release stress, so as to solve the delamination problem of the IC package during a reflow process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An integrated circuit (IC) package with stress releasing structure, comprising:
   a metal plane, having at least one first etching line for separating the metal plane into a plurality of metal plane areas;
   a substrate, formed on metal layer;
   an IC chip, formed on the substrate; and
   an IC fill layer, formed around the IC chip;
   wherein the at least one first etching line forms at least one half cut line in the metal plane and a portion of the substrate, the at least one half cut line defining a metal plane opening with a first width along a first direction and a substrate recess with a second width along the first direction, wherein the second width equals the first width,
   wherein the at least one first etching line extends underneath the IC chip.

2. The IC package of claim 1, wherein the IC fill layer has at least one second etching line for separating the IC fill layer into a plurality of areas.

3. The IC package of claim 2, wherein the at least one second etching line forms at least one half cut line to separate a portion of the IC fill layer.

4. The IC package of claim 2, wherein the at least one second etching line forms at least one half cut line to separate the entire IC fill layer.

5. The IC package of claim 1, wherein the metal plane is a copper plane.

6. The IC package of claim 1, wherein at least one of the metal plane areas is directly covered by the IC chip.

7. The IC package of claim 1, wherein at least one of the metal plane areas is fully covered by the IC chip.

* * * * *